(12) United States Patent
Chang

(10) Patent No.: US 6,980,417 B2
(45) Date of Patent: Dec. 27, 2005

(54) METER WITH CONCEALED PROBE RECEIVING DECK

(76) Inventor: Ken-Chao Chang, P.O. Box 82-144, Taipei (TW)

( * ) Notice: Subject to any disclaimer, the term of this patent is extended or adjusted under 35 U.S.C. 154(b) by 223 days.

(21) Appl. No.: 10/705,841

(22) Filed: Nov. 13, 2003

(65) Prior Publication Data

US 2005/0104576 A1   May 19, 2005

(51) Int. Cl.⁷ .............................................. H05K 5/00
(52) U.S. Cl. ...................... 361/679; 73/65.09; 324/754
(58) Field of Search ...................... 361/679; 324/754; 73/1.11, 65.09

(56) References Cited

U.S. PATENT DOCUMENTS 4,817,510 A * 4/1989 Kowalics et al. .............. 99/331
5,831,438 A * 11/1998 Okura ........................ 324/538
5,834,935 A * 11/1998 Lyford ....................... 324/156
5,963,027 A * 10/1999 Peters ...................... 324/158.1
6,692,432 B1 * 2/2004 Yarush et al. ............... 600/179

* cited by examiner

Primary Examiner—Yean-Hsi Chang

(74) Attorney, Agent, or Firm—Leong C. Lei

(57) ABSTRACT

A meter provided with a concealed probe receiving deck includes a body of the meter, a housing, one end of the lid is pivoted to the body of the meter, a space of accommodation defined between the lid and the body when the former covers upon the bottom of the body, and a probe receiving deck fixed to the bottom of the body of the meter; the deck containing a recess to receive both probes of the meter in position and a space defined by both sides of the recess to coil the cords attached to their respective probes.

5 Claims, 5 Drawing Sheets

METER WITH CONCEALED PROBE RECEIVING DECK

BACKGROUND OF THE INVENTION (a) Technical Field of the Invention

The present invention is related to a meter with concealed probe receiving deck and more particularly to one allows the probes and their cords to be received in concealment on a deck between the body of the meter and its housing.

(b) Description of the Prior Art

To facilitate portability, a meter to measure voltage and resistance generally available in the market, a notebook binder is provided to sandwich the body of the meter, and a magic tape is provided at the center of the binder to fasten the coiled cords and probes connected to the meter for storage. However, this binder type for receiving the probes and cords of the meter is found with the following flaws:

1. Whereas it does not provide the proper receiving for the cords to the probes, the cords after several times of folding for storage are vulnerable to break up.
2. Even though the meter is sandwiched by the binder, it appears a mess without a nice and tidy appearance in general, and the binder is easily aged to affect its service life.
3. Whenever the user opens up the binder, the first sight is all the cords and the probes are lying in chaos on one side of the magic tape.

SUMMARY OF THE INVENTION

The primary purpose of the present invention is to provide a meter with concealed probe receiving deck. To achieve the purpose, the present invention includes a body of the meter, a lid having its one end pivoted to the body of the meter to define a certain accommodation space between the lid and the body of the meter when the former closes upon the latter; and a probe receiving deck fixed to the bottom of the body of the meter containing two probe locking recesses to hold both probes in position while a specific area to receive the coiled cords is defined on both sides of the probe receiving deck. Accordingly, both of the probes and their attached cords are well received in designated areas in the body of the meter.

The foregoing object and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

Figure 1:
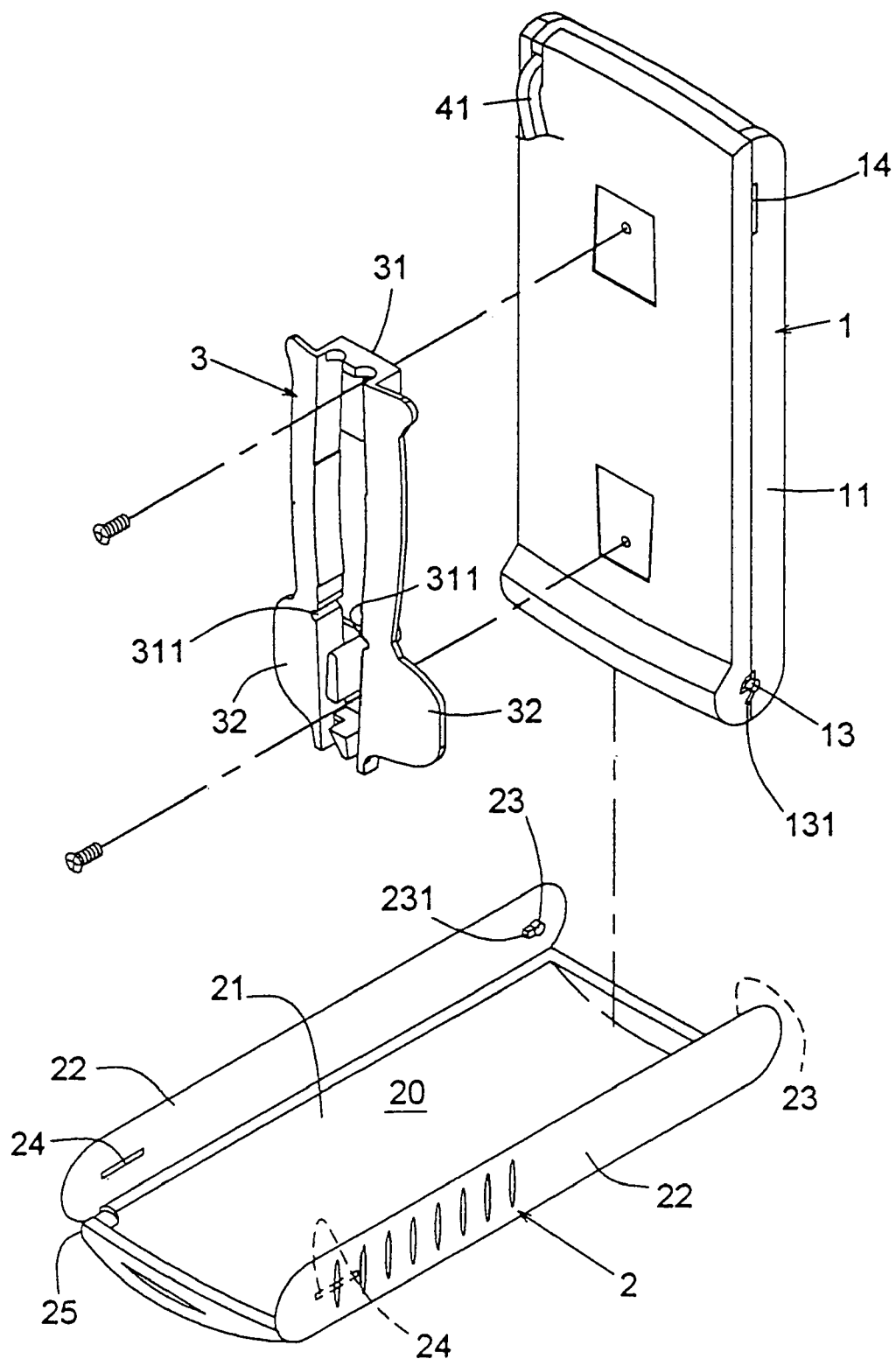
FIG. 1 is an exploded view of a preferred embodiment of the present invention.

The following descriptions are of exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Referring to FIGS. 1 through 5, a preferred embodiment of the present invention related to a meter provided with a concealed probe receiving deck includes a body (1) of the meter, a lid (2) and a probe receiving deck (3) fixed to the bottom of the body (1) of the meter. The body (1) of the meter is adapted with two probes (4) and their attached cords (41). When the meter is not used, the receiving deck (3) receives and holds in position both of the probes (4) and their cords (41) in designated areas, and then the lid (2) closes onto the bottom of the body (1) of the meter to keep both probes (4) and their attached cords (41) out of sight.

The body (1) of the meter includes a housing (11) and a detection circuit is disposed in the housing (11) to response to the numeric value measured of the resistance, current and voltage by the probes (4) and show the value on a digit display (12) mounting on the housing (11). The body (1) of the meter is related to that of the prior art and thus will not be elaborated here since it is not the subject matter for this patent application.

It is to be noted that the body (1) of the meter may be of an electronic or mechanical type.

Two pivoting recesses (13) are respectively provided on both sides at the lower end of the body (1) of the meter, and are pivoted to their respective pivots (23) provided on both sides of the lid (2). Each of both pivoting recesses (13) is provided to its peripheral in radius multiple positioning threads (131) to be screwed to a positioning protrusion (231) each provided to the external of the pivot (23) of the lid (2). When the lid (2) is lifted, it may be erected at an angle as desired in relation to the body (1) of the meter.

The lid (2), made of plastic material, contains a plate (21), a side wall (22) is each upwardly protruding from both sides of the plate (21), and the pivot (23) is each protruding from one end of the sidewall (22) to pivot into the respective pivoting recess (13) disposed on the body (1) of the meter. At least one positioning part (24) protrudes from on the inner side at another end of the side wall (22) to lock up a positioning recess (14) disposed on the body (1) of the meter when the lid (2) closes onto the body (1) of the meter to secure the erected position of the lid (2) while an accommodation space (2) is defined between the bottom of the body (1) of the meter and the plate (21) of the lid (2) when the lid (2) closes onto the bottom of the body (1) of the meter to accommodate the probe receiving deck (3).

The receiving deck (3) contains a holder (31) fixed to the bottom of the body (1) of the meter. Two locking recesses (311) are provided on the holder to merely receive and secure in position both probes (4). Two retaining wings (32) are respectively protruding from both sides of the holder (31) to define a receiving area (30) at where between those retaining wings (32) and the bottom of the body (1) of the meter for both cords (41) attached to the probes (4) to be coiled and received in sequence while both cords (41) are restricted by both retaining wings (32) in position.

Figure 2:
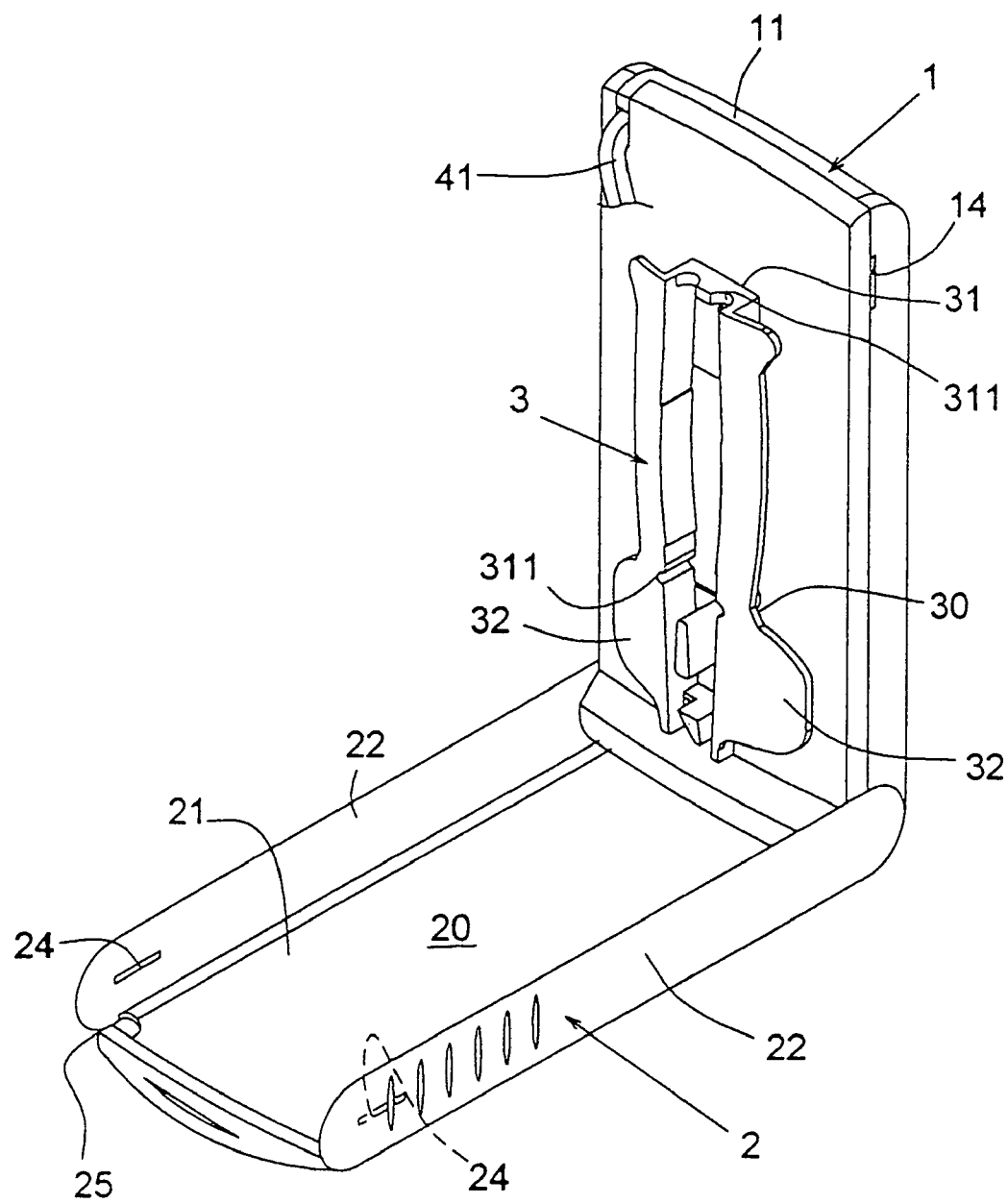
FIG. 2 is a schematic view showing that the preferred embodiment of the present invention has been spread up.
Figure 5:
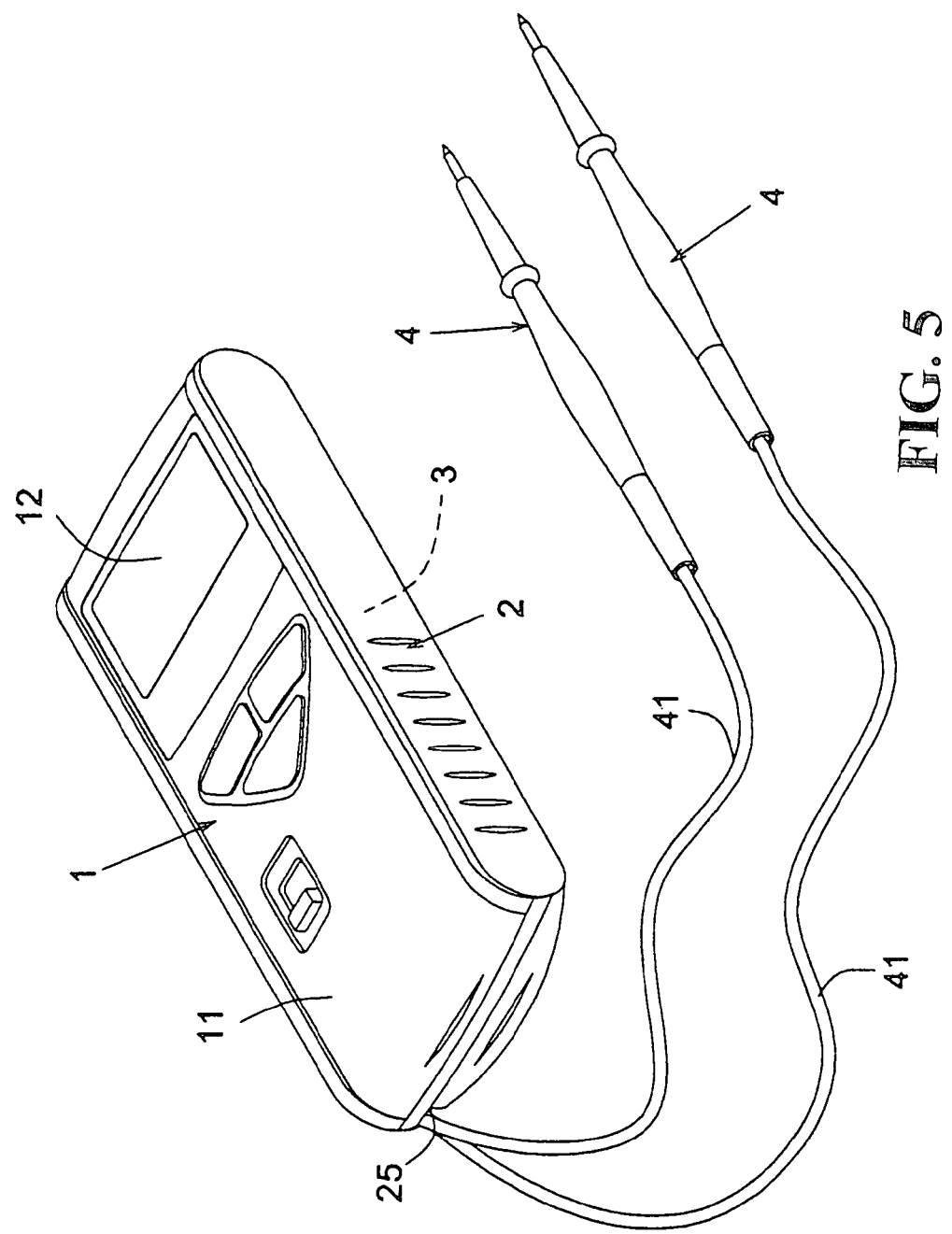
FIG. 5 is a schematic view showing the application status of the preferred embodiment of the present invention.

As illustrated in FIGS. 2 and 5, a cord outlet (25) is provided to the peripheral of the lid (2) for the cord (41) to be led out when the lid (2) has closed onto the body (1) of the meter. As illustrated in FIG. 5, the meter shall be in its operation status. However, there is no sign of a mess in the general structure since the body (1) of the meter and the lid (2) are locked to each other to allow more convenient in the use of the meter.

Figure 3:
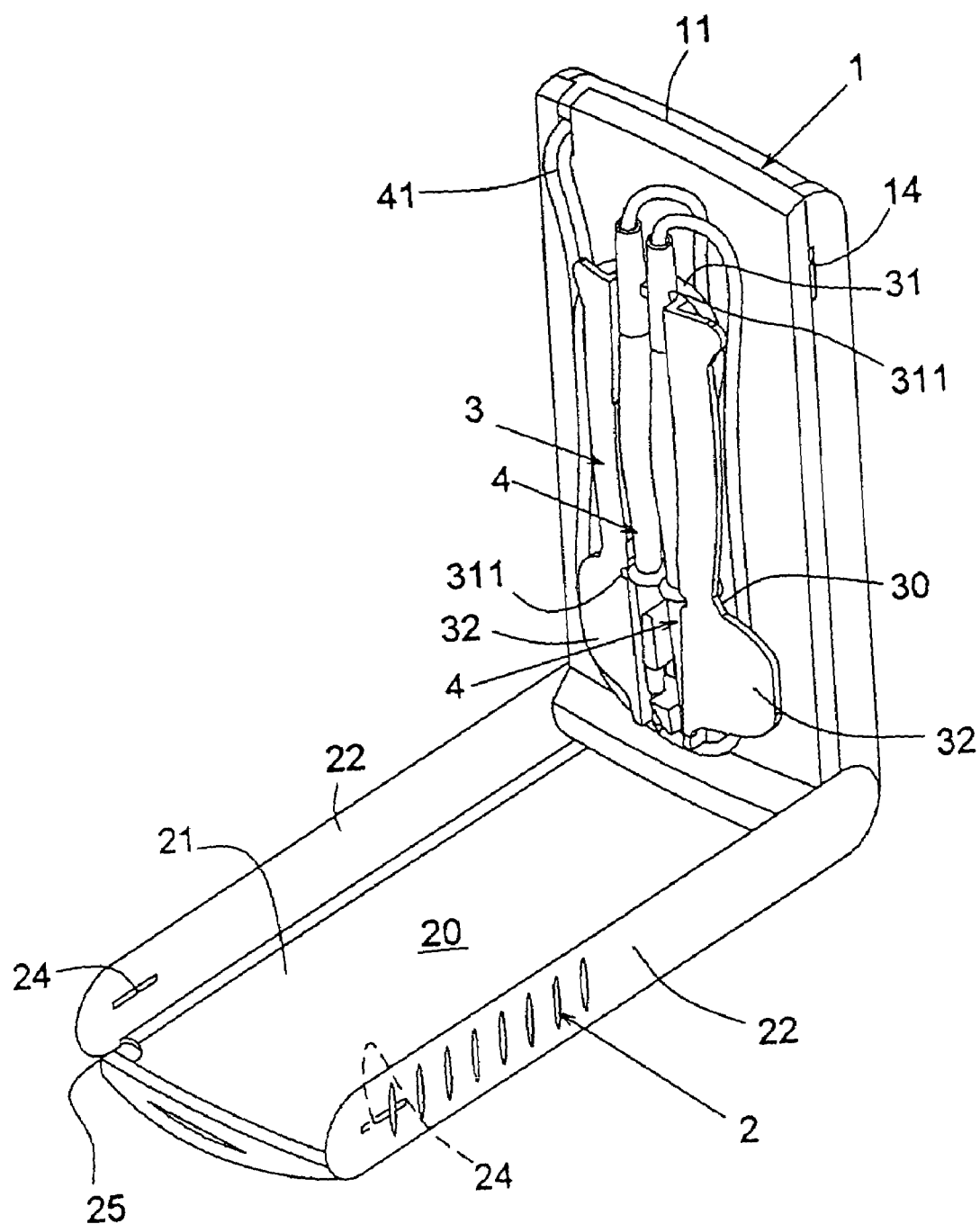
FIG. 3 is a schematic view showing that both probes and their cords are received in position in a deck provided in the preferred embodiment of the present invention.
Figure 4:
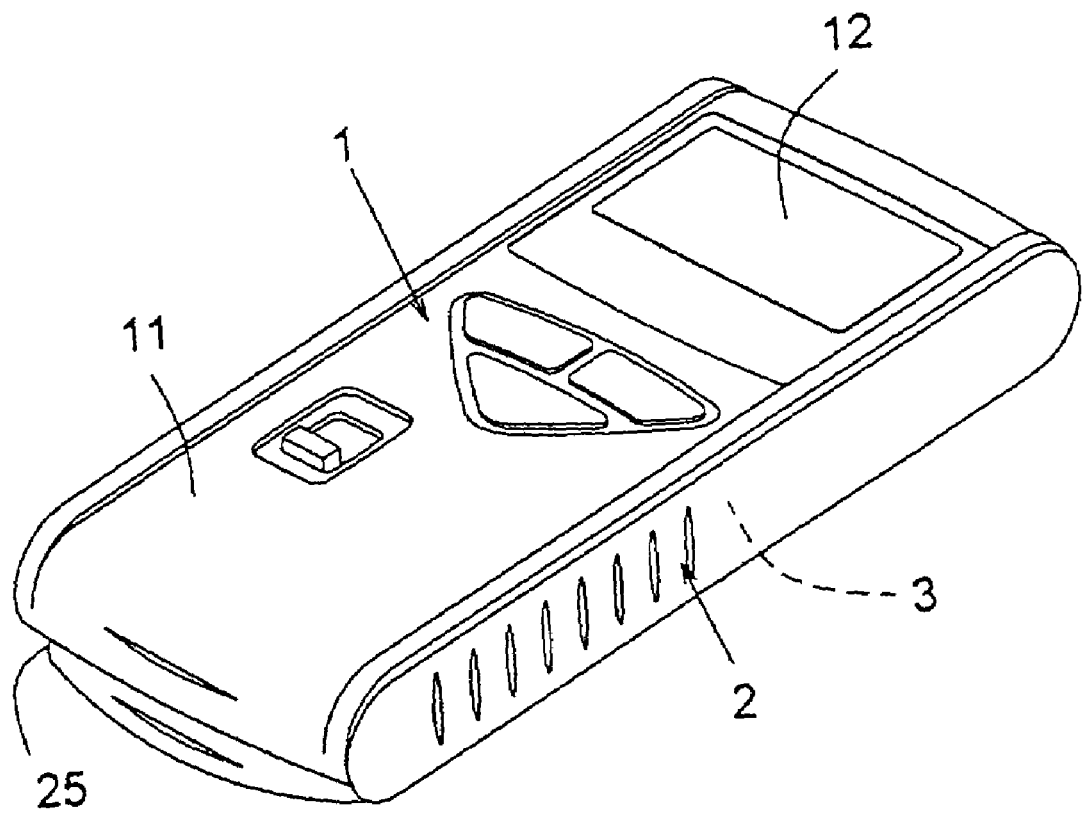
FIG. 4 is a schematic view showing that a lid has been closed upon the preferred embodiment of the present invention with both probes and cords received as illustrated in FIG. 3.

Now referring to FIG. 3, when the meter is not used, the user coil both cords (41) in sequence in the cord receiving area (3) defined on both sides of the holder (31) in the probe receiving deck, both probes (4) are respectively embedded in the probe locking recesses (311) on the holder (31), and finally the lid (2) is closed onto the body (1) of the meter. As illustrated in FIG. 4, whereas both probes (4) and their cords (41) are covered up by the lid (2) for the meter to indicate an integral unit showing attractive appearance and easy portability while preventing the accuracy of the probes (4) from being affected by the humidity from external source, e.g., storm water.

In the meter disclosed in the present invention, the cords (41) respectively attached to the probes (4) may be forthwith soldered to where inside the body (1) of the meter, or each terminal of the cords (41) may be connected to a plug from an adapter for the user to plug the adapter into its corresponding socket provided on the body (1) of the meter. The preferred embodiment disclosed herein does not limit itself to the type of the body of the meter applied.

It is to be noted that the present invention does not limit itself to any modification to the structure and form disclosed in the specifications as long as such modification is made within the teaching and scope of the present invention.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A meter with concealed probe receiving deck is comprised of a body of the meter; a lid, having its one end pivoted to the body of the meter, defining an accommodation space when the lid closing onto the bottom of the body of the meter; and a probe receiving deck, fixed to the bottom of the body of the meter, containing two probe locking recesses to receive and secure both probes in position, a cord receiving area being each defined on both sides of the probe receiving deck to receive coiled cords for both probes and the coiled cords being concealed in the body of the meter.

2. A meter with concealed probe receiving deck as claimed in claim 1, wherein, a pivoting recess is each provided on both sides at one end of the body of the meter; the pivoting recesses being pivoted to their respective pivots provided on both sides of the lid; multiple positioning threads being provided in radius to the peripheral of the pivoting recess; and a positioning protrusion being each provided externally to the pivot on the lid to screw to the respective pivoting recess through its multiple threads.

3. A meter with concealed probe receiving deck as claimed in claim 1, wherein, the lid contains a plate with a side wall being respectively erected from both sides of the plate; at least one positioning part being protruded from an inner side of one end of the side wall; and the positioning part locking up a positioning recess disposed on the body of the meter to secure the lid at an angle as desired when the lid being lifted.

4. A meter with concealed probe receiving deck as claimed in claim 1, wherein, the probe receiving deck contains a holder fixed to the bottom of the body of the meter; the two probe locking recesses being provided on the holder to merely hold two probes in position respectively; and two wings being respectively protruded from both sides of the holder to define the cord receiving area between both wings and the bottom of the meter.

5. A meter with concealed probe receiving deck as claimed in claim 1, wherein, an outlet is disposed on the peripheral of the lid to lead out the cords.

* * * * *